United States Patent

Alidina et al.

[11] Patent Number: 5,987,490
[45] Date of Patent: Nov. 16, 1999

[54] MAC PROCESSOR WITH EFFICIENT VITERBI ACS OPERATION AND AUTOMATIC TRACEBACK STORE

[75] Inventors: Mazhar M. Alidina; Sivanand Simanapalli, both of Allentown, Pa.

[73] Assignee: Lucent Technologies Inc., Murray Hill, N.J.

[21] Appl. No.: 08/970,921

[22] Filed: Nov. 14, 1997

[51] Int. Cl.[6] .................................................. G06F 7/38
[52] U.S. Cl. .......................................... 708/523; 371/43.7
[58] Field of Search ........................ 364/736.2, 715.011; 371/43.7, 43.8; 708/523, 200

[56] References Cited

U.S. PATENT DOCUMENTS

| | | | |
|---|---|---|---|
| 5,377,133 | 12/1994 | Riggle et al. | 364/736 |
| 5,450,338 | 9/1995 | Oota et al. | 364/715.1 |
| 5,502,736 | 3/1996 | Todoroki | 371/43 |
| 5,633,897 | 5/1997 | Fettweis et al. | 371/43.7 |
| 5,751,734 | 5/1998 | Choi et al. | 371/43.7 |
| 5,781,569 | 7/1998 | Fossorier et al. | 371/43.7 |

OTHER PUBLICATIONS

Users guide, Texas Instruments TMS320C54X "1995 Preliminary Digital Signal Processing Products", Nov. 6, 1997, pp. 2.2, 3.15–3.17, 8.64, and 12.47–12.50.

Henry Hendrix, "Viterbi Decoding Techniques in the TMS320C54X", pp. 1–19, Jun. 1996.

*Primary Examiner*—David H. Malzahn
*Attorney, Agent, or Firm*—Darby & Darby

[57] ABSTRACT

A dual-MAC processor optimized so that two Viterbi ACS operations, including traceback bit storage, can be executed in two machine cycles is disclosed. The processor comprises a pair of adder arithmetic logic units connected to a common accumulator register bank and supporting full and split-mode add, subtract, and compare operations. Viterbi compare operations are executed using the subtract function and the sign bit is combined with a compare mode bit to generate a traceback output which indicates the proper traceback bit to store. When a compare operation is performed and a Viterbi mode bit is active, each generated traceback output is shifted into a traceback register for later use in a Viterbi traceback routine.

17 Claims, 5 Drawing Sheets

FIG. 5

| COMMAND | SPLIT (70) | SUBT. (72) | COMP (74) | CTL 1 (51) | CTL 2 (52) | CTL 3 (53) | CTL 4 (54) | CTL 5 (55) | CTL 6 (56) |
|---|---|---|---|---|---|---|---|---|---|
| $A+B$ | 0 | 0 | 0 | $B_h$ | $A_L$ | $B_L$ | CARRY | $S_1$ | $S_0$ |
| $A-B$ | 0 | 1 | 0 | $B_h$ | $A_L$ | $B_L$ | CARRY | $S_1$ | $S_0$ |
| $A_h+B_h; A_L+B_L$ | 1 | 0 | 0 | $B_h$ | $A_L$ | $B_L$ | SUBT. | $S_1$ | $S_0$ |
| $A_h-B_h; A_L-B_L$ | 1 | 1 | 0 | $B_h$ | $A_L$ | $B_L$ | SUBT. | $S_1$ | $S_0$ |
| $cmp(A,B)$ | 0 | 1 | 1 | $B_h$ | $A_L$ | $B_L$ | CARRY | $A_h/B_h$ | $A_L/B_L$ |
| $cmp(A_h,A_L)$ | 1 | 1 | 1 | $A_L$ | 0 | 0 | SUBT. | $A_h/A_L$ | 0 |

MAC PROCESSOR WITH EFFICIENT VITERBI ACS OPERATION AND AUTOMATIC TRACEBACK STORE

TECHNICAL FIELD

This invention is related to a dual-MAC processor with an architecture optimized for efficient calculation of the Viterbi add-compare-select operation.

BACKGROUND OF THE INVENTION

In an effort to achieve the demanding speed requirements of such data processing applications as high-speed digital communication and voice processing systems, use has been made of the digital signal processor (DSP), which is a special-purpose CPU utilized for digital processing and analysis of signals from analog sources, such as sound. The analog signals are converted into digital data and analyzed using various algorithms, such as Fast Fourier Transforms. DSPs are designed for particularly fast performance of certain operations, such as multiplication, multiplying and accumulating, and shifting and accumulating, because the mathintensive processing applications for DSPs rely heavily on such operations. For this reason, a DSP will typically include special hardware circuits to perform multiplication, accumulation and shifting operations.

One form of DSP architecture that exhibits significant benefits in processing speed is known as a Multiply-Accumulate or MAC processor. The MAC processor implements an architecture that takes advantage of the fact that the most common data processing operations involve multiplying two values, then adding the resulting value to another and accumulating the result. These basic operations are efficiently carried out utilizing specially configured, high-speed multipliers and accumulators, hence the "Multiply-Accumulate" nomenclature.

Another method for increasing processing speed is to perform different processes concurrently. Towards this end, DSP architectures with plural MAC structures have been developed. For example, a dual MAC processor is capable of performing two independent MAC operations concurrently. A simplified block diagram of a typical dual MAC processor 10 is illustrated in FIG. 1. Each half of the processor 12 has a 2-input multiplier 14 which receives input from an x or y (input) register 13 and stores its output in a product register 16. The product register is connected to one input of an adder 18, the output of which may selectively be stored in one of several accumulator registers 20. A second input of the adder 18 is connected to the accumulator array 20 to allow for a continuous series of cumulative operations. Additional data control signals (not shown) may allow the registers 13 to bypass the multiplier be connected directly to the inputs of adders 18. Conventional vector processors may have one or several MAC processors operating in parallel.

The DSP16000 dual-MAC processor, available from Lucent Technologies, includes a data arithmetic unit (DAU), which constitutes the primary computational unit. The inputs to the multipliers of the DAU are applied through a pair of double length registers designated as the x and y registers, while the output of each multiplier is applied to a respective product register. Concurrent accumulations are achieved by providing both two-input arithmetic logic unit (ALU) and a three-input adder, either of which may accumulate the data in either product register. When mathematical functions are performed by the ALU or adder, the result is stored in an accumulator register, a number of which are present in the DAU.

In wireless and wireline applications, particularly those with significant intersymbol interference, DSP's are used to perform data error detection and correction using convolutional encoding and Viterbi Decoding. Convolutional encoding is performed by convolving a data input bit with one or more previous uncoded input bits. The convolved data is decoded using the well known Viterbi algorithm. The Viterbi algorithm uses knowledge about the possible state transitions of the encoder from one given state to the next to determine the most likely encoder input given the received data.

FIG. 2 is an illustration of the basic Viterbi algorithm butterfly computation. Four possible encoder transitions from present state (PS) to next state (NS) are illustrated. The present state is equivalent to the numeric value of the data stored in a shift register of the encoder. When a bit is input, the encoder register is shifted to the right and the input bit is moved into the most significant bit position (shown in bold in the next state). Thus, as illustrated, $NS_0$ can be reached with a 0 input bit from either $PS_0$ or $PS_1$. Similarly, $NS_8$ can be reached with a 1 input bit from either $PS_0$ or $PS_1$. The Viterbi algorithm provides a way to determine which of the two possible transition paths is the most likely, e.g., which is the survivor path.

This determination consists of two basic steps. The first step is a branch metric computation which determines the Euclidean distance between the received data symbol and the actual data symbol which would result from a state transition from the present to a next state. The branch metric for a transition from a present state i to a next state j at instant k is signified as $m_{i,j}(k)$ and is represented by the equation:

$$m_{ij}(k) = \sum_{n=0}^{R-1} |x_n(k) - c_{n,ij}|^2 \qquad \text{(Equ. 0)}$$

where $x_n(k)$ is the received nth symbol, $C_{n,ij}$ is the actual symbol that would result from state transition of i to j (which is determined from the structure of the convolutional encoder), and the rate of the encoder (e.g., the number of output bits for every input bit) is 1/R. For a rate 1/R encoder, two branch metrics must be computed for each next state.

Once the branch metric for all possible state transitions is calculated, the accumulated distance is calculated for each input path and the path with the minimum distance (i.e., maximum probability) is selected as the survivor path. This step is known as Add-Compare-Select, or ACS. The third step is known as traceback. This step traces the maximum likelihood path through a trellis of possible present state to next state transitions, as determined by the first two steps, and reconstructs the path through the trellis to extract the original input data. In this example, the survivor path is represented by the least significant bit of the present state, conventionally referred to as the traceback bit (shown in bold in FIG. 2). For example, if the path from present state $S_1$ is chosen over the path from present state So, the traceback bit is 1.

The ACS operation can be broken into two steps: (1) the Add operation, or path metric computation, and (2) the Compare-Select operation. The path metric add operation is the accumulation of the present state cost (a value initialized by the user at the start of the Viterbi processing) and the branch metric values. As shown in FIG. 2, the two path metrics for next state 0000 are:

$$PS_0 + m_{0,0} \text{ and } PS_1 + m_{1,0} \qquad \text{(Equ. 1)}$$

and for next state 1000 are:

$$PS_0+m_{0,8} \text{ and } PS_1+m_{1,8} \quad \text{(Equ. 2)}$$

Once calculation of the two path metrics for each state is completed, the values are compared and the minimum or the maximum, depending on implementation details, is selected as the survivor cost and the corresponding traceback bit (TB) is determined and stored. This operation for the path metrics of Equs. 1 and 2 can be expressed, for example, as:

$$NS_0=\min(PS_0+m_{0,0},PS_1+m_{1,0}) \quad \text{(Equ. 3)}$$

$$TB_0=0 \text{ if } NS_0=PS_0+m_{0,0} \text{ else } TB_0=1 \quad \text{(Equ. 4)}$$

and $$NS_8=\min(PS_0+m_{0,8},PS_1+m_{1,8}) \quad \text{(Equ. 5)}$$

$$TB_8=0 \text{ if } NS_8=PS_0+m_{0,8} \text{ else } TB_8=1 \quad \text{(Equ. 6)}$$

The above equations represent the analysis for a general decoder. For the more specific class of decoders having the property that the metric $m_{0,8}=-m_{0,0}$, equations 2 can be expressed as:

$$PS_0-m_{0,0} \text{ and } PS_1-m_{1,0} \quad \text{(Equ. 2a)}$$

and Equations 5 and 6 can be expressed as:

$$NS_8=\min(PS_0-m_{0,0},PS_1-m_{1,0}) \quad \text{(Equ. 5a)}$$

$$TB_8=0 \text{ if } NS_8=PS_0-m_{0,0} \text{ else } TB_8=1 \quad \text{(Equ. 6a)}$$

Although dedicated hardware Viterbi decoders constitute efficient and successful strategies for data detection, it is useful to implement a Viterbi algorithm using a signal and data processor which can be programmed for other applications as well. One form of architecture which has been used for this purpose is the MAC processor, discussed above.

Attempts have been made to optimize MAC processors to optimize speed of execution of the Viterbi ACS operations. For example, the TMS320C5xx single-MAC DSP from Texas Instruments provides an instruction which allows either Equ. 1 or Equ. 2 to be evaluated in one cycle by using a split mode 16-bit add/subtract operation. However, one-cycle performance can only be achieved for an encoder configured so that branch metric $m_{1,0}=-m_{0,0}$ and thus this performance cannot be achieved for when the encoder does not have this property. The TMS320C5xx chip also provides a single cycle instruction to perform Equs. 3 and 4 concurrently or Equs. 5 and 6 concurrently using only a "maximum" criteria, and thus cannot easily perform a Viterbi algorithm implemented to require the minimum of the path metric values because the generated traceback bits are altered. Further, the compare and select operations are implemented using a dedicated comparator unit which is separate from the primary adder or arithmetic logic unit.

Texas Instruments also provides a dual-MAC DSP, part number TMS320C6xx, which can evaluate Equs. 1 and 2 in a single cycle. However, this chip does not contain the necessary hardware to perform Equs. 3, 4, 5, and 6 in a single cycle because the traceback bit is not automatically generated and stored in a traceback register but instead must be explicitly shifted into an appropriate register using an additional command. Thus, additional machine cycles are required to store a traceback bit based on the results of the comparison, reducing the efficiency of Viterbi decoding.

A dual-MAC processor of the present invention comprises a pair of adder units and/or arithmetic logic units (ALU) operating in parallel and connected to a common accumulator register bank. The processor is optimized so that two Viterbi ACS operations, including traceback bit storage, can be executed in two machine cycles. Each adder/ALU comprises means to add, subtract, and compare one pair of data inputs when a full mode operation is performed or two pairs of data input when a split mode operation is performed. According to the invention, compare operations are executed using the subtract function of the adder/ALU and the sign bit is combined with a compare mode bit to generate a traceback output which indicates the proper traceback bit to store during the compare portion of Viterbi convolutional decoding. Each traceback output is connected to the input of a traceback shift register. When a compare operation is performed and a Viterbi mode bit is active, the generated traceback output is shifted into the traceback register. Each adder/ALU is configured with a subset of full and split-mode functions optimized to perform efficiently Viterbi add-compare- select.

BRIEF DESCRIPTION OF THE DRAWINGS

The foregoing and other features of the present invention will be more readily apparent from the following detailed description and drawings of illustrative embodiments of the invention in which:

FIG. 5 is a table of the minimum command set and the associated control bits for the logic in FIG. 4.

DETAILED DESCRIPTION OF THE PREFERRED EMBODIMENT(S)

Figure 1:
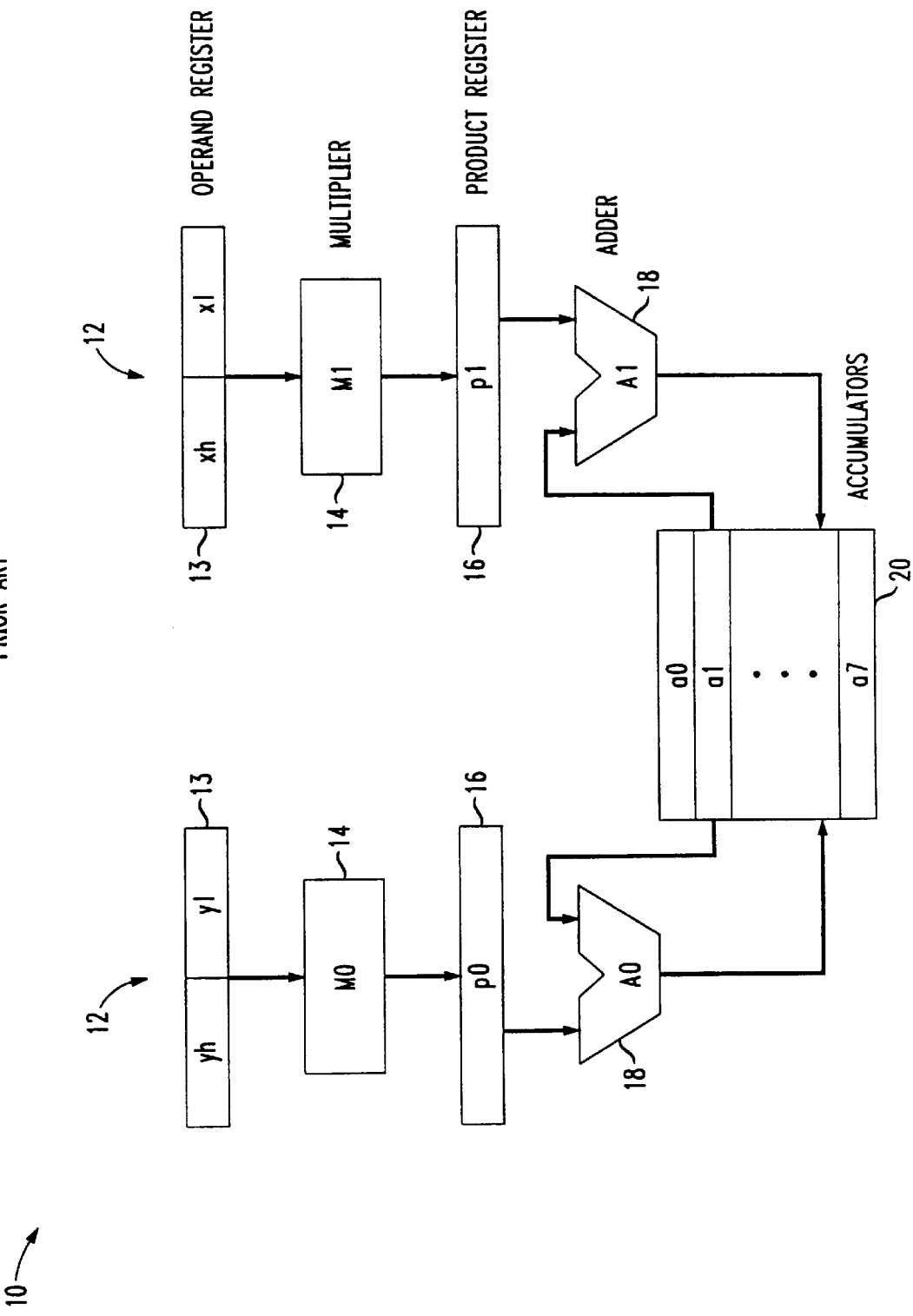
FIG. 1 is a block diagram of a typical dual-MAC processor.
Figure 2:
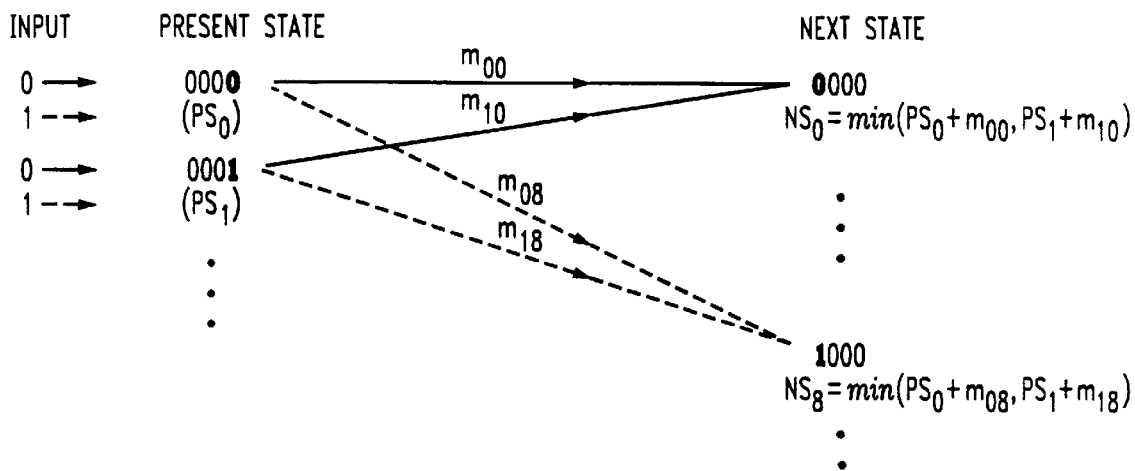
FIG. 2 is an illustration of the Viterbi butterfly.
Figure 3A:
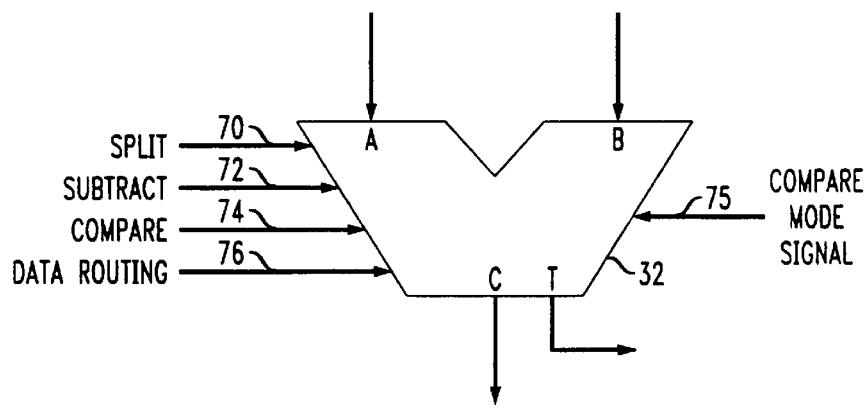
FIG. 3a illustrates the control signals for an add/subtract unit in FIG. 3.
Figure 3:
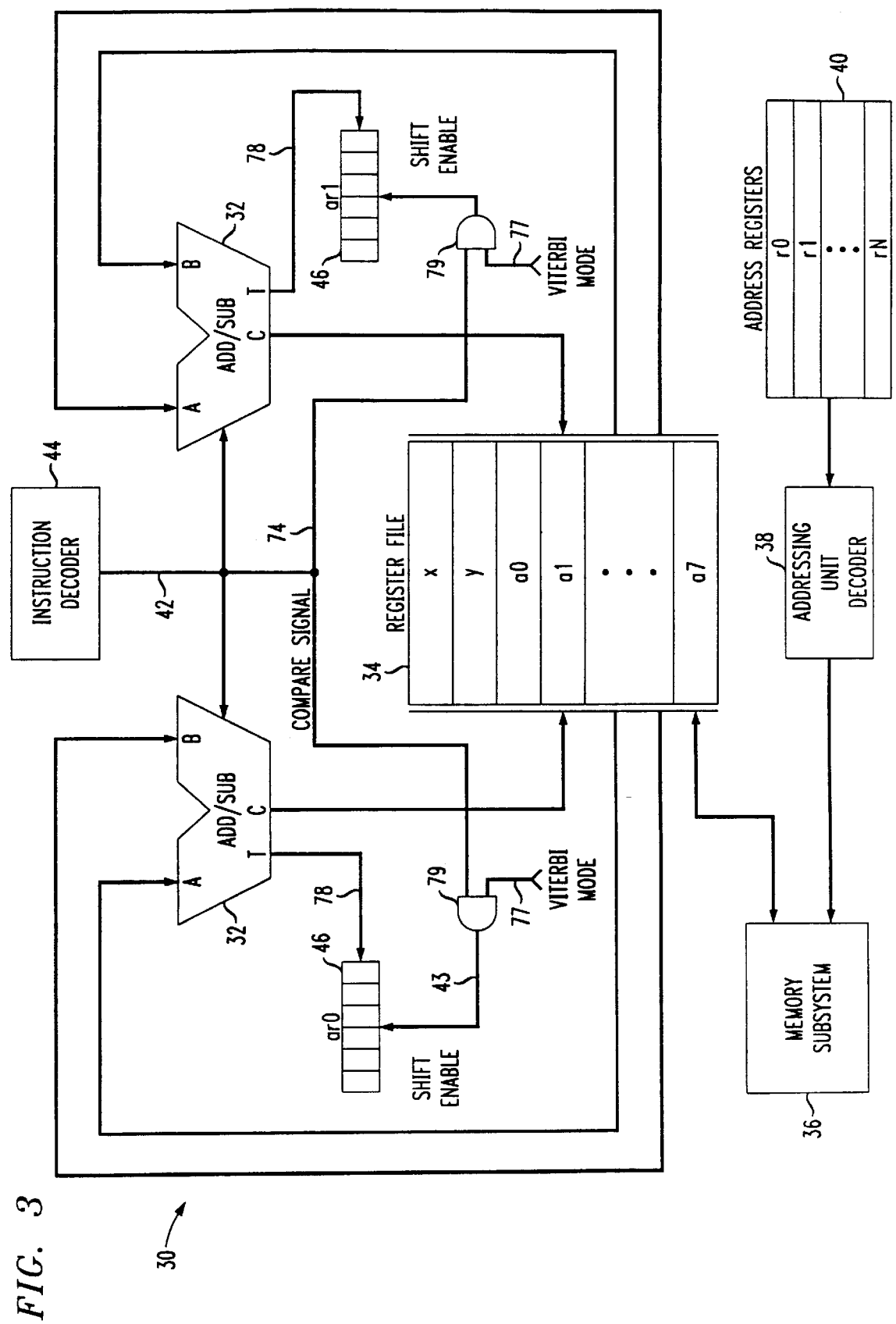
FIG. 3 is block diagram of the accumulate portion of a dual-MAC processor according to the present invention.

FIG. 3 is block diagram of the accumulate portion of a dual-MAC processor 30 according to the present invention which comprises two Add/Subtract units 32, one or more of which may be ALUs, and are hereafter referred to as an Adder 32, which receive inputs A and B from and store output C to a register file 34. The register file 34 may comprise both discrete registers as well as the x and y registers and the accumulator array, as will be known to those skilled in the art. In addition to storing output data from the Adders 32, the registers can be loaded with data stored in a particular address of a memory subsystem 36 by means of an address unit decoder 38 connected to one or more address pointer registers 40. As part of retrieving data from memory, a mechanism is provided for simultaneously incrementing the address pointer. Various arrangements for loading and storing data according to address pointers and simultaneously incrementing the utilized pointer are well known in the art. Simultaneous data operation and register loads are provided by means known to those skilled in the art to provide for pipelined as well as parallel operations. In the preferred embodiment, the data registers and data I/O for adders 32 are 32-bits wide and may be utilized in 16-bit high and low segments.

The data flow and operations performed by the adders 32 are controlled by a plurality of control signals 42 which are received from an instruction decoder 44. According to the invention, each adder 32 performs a 32-bit addition or subtraction or two 16-bit split-adds or 16-bit split-subtracts, depending on the values of the control signals 42. 32-bit or 16-bit comparisons can be performed using the subtract function of adders 32. Additional logic is included to allow for return of either the minimum or maximum value after a compare as well as the generation of a traceback bit T for use during Viterbi add-compare-select. This is discussed below.

FIG. 3a illustrates the various elements of the control signals 42 which are input to an Adder 32. Control signals 42 comprise a split signal bit 70 which indicates a normal or split mode operation, a subtract signal bit 72 indicating that a subtract command is to be performed, a compare signal bit 74, indicating that a compare operation is to be performed, a compare mode signal bit 75, indicating whether the compare should return a minimum (set inactive) or a maximum value (set active), and a plurality of data routing signal bits 76 which control how data inputs A and B are processed.

Each adder 32 is connected to a traceback shift register 46 by traceback signal 78. (FIG. 3) The traceback register 46 can also be read and written by the user. When a Viterbi operation mode signal 77 is set and a compare operation is executed, a shift enable signal 43 is applied to the shift register 46, e.g., through AND gate 79, so that the data in the shift register 46 is left-shifted and the generated traceback bit output T is stored as the least significant bit. Preferably, each traceback register 46 is 16-bits wide and is implemented using conventional techniques. In an alternate embodiment, the traceback register 46 may be configured so that more than one bit can be "stuffed" a time. According to the invention, the compare operation and traceback bit stuffing is executed in a single cycle.

Each adder 32 is configurable to perform a set of operations suited for Viterbi decoding. However, unlike prior art solutions which utilized dedicated Viterbi hardware separate from the primary adders, each adder 32 also serves as the primary adder or arithmetic logic unit (ALU) for the dual-Mac processor. Thus, while only a subset of operations is discussed herein, according to the invention, at least one of the adders 32 supports a standard set of ALU operations as is known to those of skill in the art.

Figure 4:
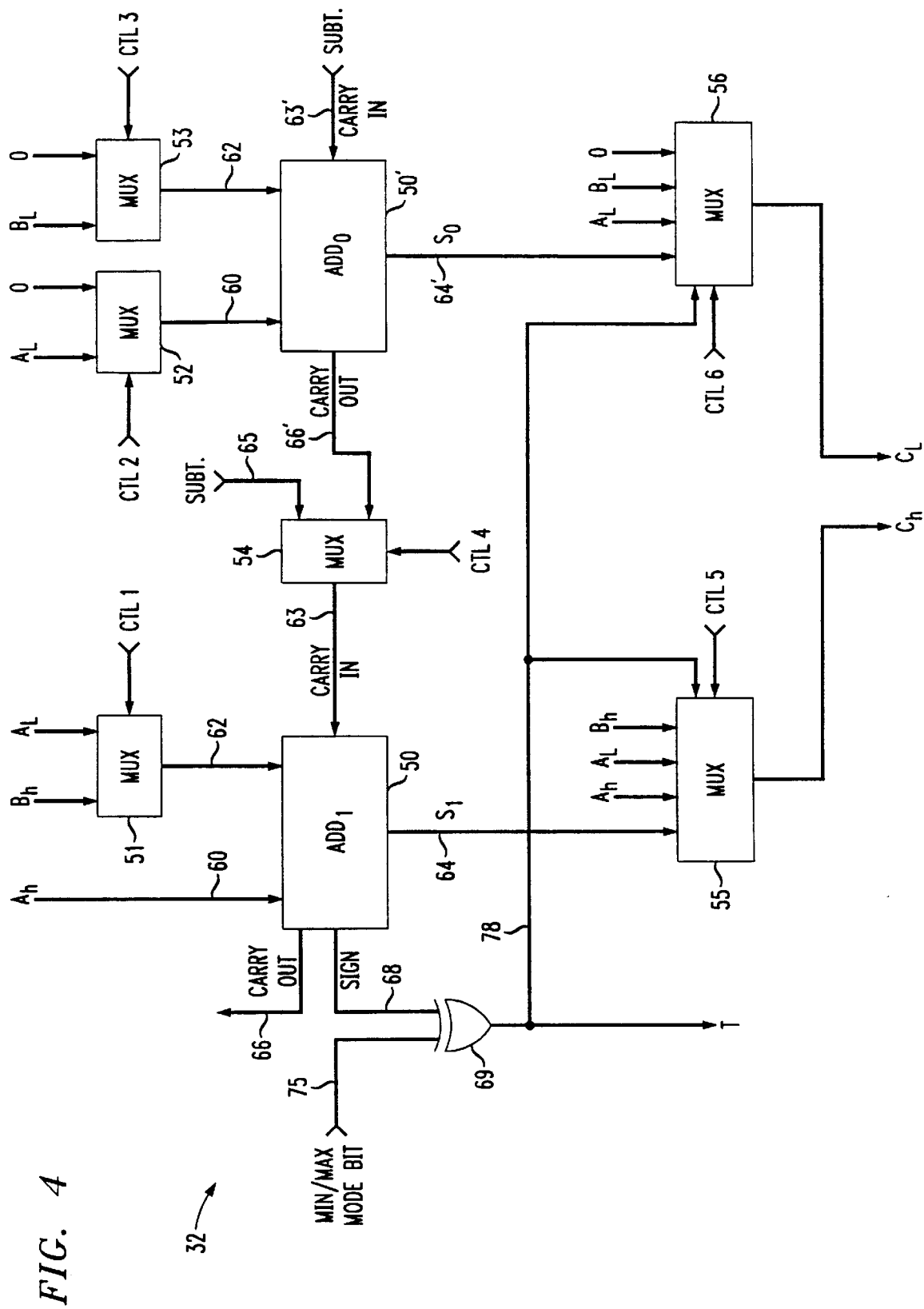
FIG. 4 is a block diagram of an add/subtract unit in FIG. 3.

The structure and control sequences for each adder 32 are detailed in FIGS. 4 and 5. Only those controls related to the present invention are specified in detail and, as will be apparent to those skilled in the art, additional control logic can easily be added to provide additional arithmetic functionality in accordance with the requirements of a particular embodiment. The specific control signal bits 70–76 shown in FIG. 3a have been omitted from FIG. 4 for clarity.

According to a preferred embodiment of the invention, each adder 32 comprises two add/subtract subunits 50, 50' which can operate in conjunction to perform full calculation operations or they can operate independently to perform parallel split-mode calculations. For example, in the preferred embodiment, the subunits 50 can perform two 16-bit adds simultaneously or one 32-bit add. Each subunit 50, 50' receives two data inputs 60, 62 and a carry-in bit 63 and has a primary data out signal 64 and a carry-out signal 66. Further, at least one subunit 50, 50' provides for a sign signal 68 output.

To support split-mode operations, the inputs A, B to each Adder 32 are split into high-order and low-order segments, represented as $A_h, A_L$ and $B_h, B_L$ respectively. Similarity, the output C is divided into $C_h$ and $C_L$. For 32-bit data signals, the high order segment represents bits 31–16 and the low order segment represents bits 15-0. Thus, two 32-bit registers can store 4 16-bit values which can be operated on during split-mode processing.

The input and output signals for each subunit 50, 50' are gated through a series of selection circuits, here shown as multiplexers (MUX) 51–56 which are controlled by data routing signal bits 76 to select the data segments to process and the appropriate output, in accordance with the decoded instruction. Control signals for multiplexers 51–56 are designated CTL 1–CTL 6, respectively, and are identified separately for convenience and clarity. However, several multiplexers can share the same control signals as will be apparent to those skilled in the art.

MUX 54 is used to connect subunits 50, 50' together or to allow for split-mode operation. When the units are joined, multiplexer 54 connects the carry-out signal 66 from subunit 50' to the carry-in signal 63 of subunit 50. When a split-mode operation is performed, multiplexer 54 connects signal 65 to the carry-in signal 63 of subunit 50.

The arithmetic functionality for each subunit 50, 50' is implemented using conventional techniques. Preferably, twos-compliment subtraction is performed whereby all the data bits of one operand are inverted and the carry-in bit is set to 1. Therefore, when a subtraction is performed, the carry-in signal 63 for subunit 50' set to 1 and for an addition, this signal is set to 0. Similarly, when performing a split-mode subtraction, input 65 for subunit 50 is set to 1. Thus, as indicated in FIG. 4, the carry-in signals may be driven by the subtract signal bit 72 generated by instruction decoder 44.

According to the present invention, minimum and maximum compare operations are performed, not by separate hardware as in the prior art, but by utilizing the subtract capabilities of subunits 50, 50'. The sign of the calculated difference is output as sign signal 68. The sign signal 68 and the compare mode signal bit 75 are complimented by a compliment circuit such as XOR gate 69 to generate signal 78. According to the invention, this signal indicates which of the two compared data values to pass to the output as well as the appropriate traceback bit to store in the traceback register 46 when a Viterbi compare-select operation is indicated by Viterbi mode signal 77.

For example, to compare A with B, A–B is evaluated. If A is less than B, the sign of the result is negative and the sign signal 68 is 1. If the minimum value is desired, the compare mode signal bit 75 is set to 0 and signal 78 will be 1. With reference to Equ. 3, above, if A=PS0+m00 and B=PS1+m10, the value of signal 78 also provides the proper traceback bit value. Similarly, if the maximum value is desired, the compare mode signal bit 75 is set to 1 and signal 78 will therefore be 0.

According to the invention, the adder 32 is configured to perform six single-cycle operations optimized for Viterbi processing in addition to any basic operations which may also be provided. The specialized instructions are: (1) A+B, (2) A–B, (3) $A_h+B_h$; $A_L+B_L$, (4) $A_h-B_h$; $A_L-B_L$, (5) cmp (A,B), and (6) cmp($A_h, A_L$). The control signals for each command are summarized in FIG. 5 and are discussed below with reference to 32-bit data registers, although register lengths of different sizes can also be accommodated.

The A+B operation is a 32-bit add. An appropriate instruction is decoded so that the split signal bit 70, subtract signal bit 72, and compare signal bit 74 are all zero. Subunit 50 performs the high order portion of the add, $A_h+B_h$, and therefore control signal CTL 1 for MUX 51 selects the $B_h$ input. Subunit 50' performs the low order portion of the add and therefore control signals CTL 2 and CTL 3 set MUX 52 and 53 to select $A_L$ and $B_L$ respectively. Because this is not a split-mode operation, MUX 54 is set via CTL 4 to connect the carry-out signal 66' of subunit 50' to the carry-in 63 for subunit 50. Output MUX 55 and 56 are set via control signals CTL 5, CTL 6 to select data signals 64, 64' (i.e., the results of the addition S1, S0) which form the high-order and low-order portions of output C respectively. The A-B function is performed similarly, except that the subtract signal bit 72 is high.

The next two commands are parallel split-mode add and subtracts. According to the preferred embodiment, the high-order segment of inputs A and B are processed by subunit 50 and the low-order segments of inputs A and B are processed by subunit 50'. However, other data segment pairings may also be provided. For a split mode add or subtract, input MUX 51, 52, 53, 55 and 56 are each controlled as in the 32-bit add or subtract, discussed above. However, the split signal bit 70 is active, indicating that MUX 54 should disconnect the two subunits 50, 50' from each other and instead route input 65 to the carry-in signal 63 of subunit 50.

The remaining two commands are the compare operations, which, according to the invention, are used for both Viterbi and non-Viterbi applications. For the 32-bit compare, cmp(A,B), multiplexers 51–53 are configured as discussed above and the carry-out signal 66 of subunit 50' is connected to the carry-in input 63 for subunit 50 via multiplexer 54. As discussed above, compares are performed by subtraction, and therefore the subtract signal bit 72 is active. For a 32-bit compare, output MUX 55 is set to select either $A_h$ or $B_h$ and MUX 56 is set to select either $A_L$ or $B_L$, depending on the results of the compare and the value of the compare mode signal bit 75, indicating whether a minimum or maximum value is to be returned. Both these conditions are represented by signal 78, as discussed above. When signal 78 is low, the "A" data is selected, otherwise the "B" data is selected. A 16-bit compare is performed essentially the same as the 32-bit compare. According to the preferred embodiment, the comparison is performed on subunit 50 and thus the split signal bit 70 is active and a 16-bit subtract is performed. Because this operation does not utilize subunit 50', the null data sequence inputs, here indicated as "0", and null data outputs are selected as indicated in FIGS. 4 and 5 to ensure that spurious data is not generated by the system.

Those skilled in the art will recognize that other mechanisms are available to avoid propagation of spurious data when an operation utilizing only sub-unit 50. Thus, MUX 55 and MUX 56 are not required to implement the command set discussed herein and, in fact, can be omitted if desired. Those skilled in the art will also recognize that other data inputs can be provided instead of a null data sequence to provide additional functionality. Further, although the output selectors MUX 55 and MUX 56 are illustrated as receiving all possible data inputs (i.e., MUX 55 selects from S1, $A_h$, $A_L$, and $B_h$), in an alternate configuration these data output selectors may simply receive the selected inputs to subunits 50, 50' as determined by selection MUX 51, 52, and 53. Thus, for example, MUX 55 would select from output signal 64 from subunit 50 or input signals 60, 62 to subunit 50.

The use of the dual-MAC processor configuration according to the invention and as described above to perform a Viterbi ACS operation will now be discussed. During initialization and branch metric calculation of the Viterbi decoding algorithm, two data arrays are established in memory 36. One array contains present state values in sequence and is pointed to by pointer register pt0. The second array contains calculated branch metric values, also in sequence, and is pointed to by pointer r0. The pointers are both initially set to point to the first values in the array. Initialization also entails setting the Viterbi operation mode bit to enable the traceback bit stuffing into the traceback shift register 46 and selecting whether compares are minimum or maximum compare operations. In the preferred embodiment, the memory subsystem 36 allows two data register values to be loaded in a single cycle in conjunction with the execution of a dual-MAC operation and the register lengths are twice as wide as the present state and branch metric values, so that two values may be stored in a single register.

The discussion below assumes that the convolutional encoder is of the class having the property that the metric $m_{1,0}=-m_{0,0}$. Thus, equations 2a, 5a, and 6a will be used. However, this discussion is not limited to this class and, as will be recognized by those of skill in the art, a similar sequence of data operations implementing equations 2, 5, and 6, above, can easily be selected to decode a data from a more general encoder.

At the start of the ACS algorithm, the data pipeline must also be initialized. The a4 register is preloaded with the first two present state costs, PS0 and PS1, the y-register is preloaded with the first two branch metric values, m0 and m1, and the pointers are incremented accordingly. This may be represented by the commands a4=*pt0++; y=*r0++. The "*" indicates an indirect load. For example, register a4 is loaded with the contents of the memory location pointed to by pt0, after which the address in pt0 is incremented.

Once initialization is complete, equations 1 and 2a, above, are performed as a single cycle pipelined instruction which performs the following operations in parallel:

$a0_h$=a4h+yh; $a1_h$=a4h-yh; y=*r0++

$a0_L$=a4l+yl; $a1_L$=a4l-yl; a4=*pt0++

The two adds are performed as 16-bit split adds in one of the two adders 32 using accumulator a4 and register y as the inputs and accumulator a0 as the output. As a result, $a0_h$=PS0+m00 and $a0_L$=PS1+m10, equivalent to Equation 1, above. The two subtracts are performed as 16-bit split subtracts on the other Adder 32 using accumulator a1 as the output. As a result, $a1_h$=PS0−m00 and $a1_L$=PS1−m10, equivalent to Equation 2, above. In addition, the next two present state costs and branch metrics are also fetched, so that y=m21,m31 and a4=PS2,PS3. Thus, once the pipeline is initialized, the Viterbi Add operation can be completed in a single cycle.

The Compare-Select Operation is performed as a single cycle instruction which executes the following 16-bit compare operations in parallel:

a2=cmp($a0_h$,$a0_L$) a3=cmp($a1_h$,$a1_L$).

One compare operation is performed on each adder 32. Because the viterbi mode bit is selected, the generated traceback bit is automatically shifted into the traceback registers 46. When a minimum compare is selected, this operation results in:

a2=min(PS0+m00, PS1+m10):NS0; ar0=ar0<<1, ar0[0]= sign_of($a0_h$−$a0_L$):TB0 a3=min(PS0−m00, PS1−m10):NS8; ar1=ar1<<1, ar1[0]= sign_of($a1_h$−$a0_L$):TB8 where ar0 and ar1 are the two traceback registers 46 and the "<<1" represents a one bit left shift of the register preceding the symbol. When a maximum compare is selected, this operation results in:

$$a2 = \max(PS0 + m00, PS1 + m10):NS0;$$

$$ar0 = ar0 \ll 1, ar0[0] = sign\_of(a0_L - a0_h):TB0$$

$$a3 = \max(PS0 - m00, PS1 - m10):NS8;$$

$$ar1 = ar1 \ll 1, ar1[0] = sign\_of(a1_L - a0_h):TB8$$

This is equivalent to Equs. 3, 4, 5a, and 6a, above. Thus, the Viterbi compare select operation can be performed in a single cycle. Accordingly, a complete ACS iteration for two path metrics can be executed by a dual-MAC processor according to the invention in two machine cycles.

While the invention has been particularly shown and described with reference to preferred embodiments thereof, it will be understood by those skilled in the art that various changes in form and details may be made therein without departing from the spirit and scope of the invention.

We claim:

1. A parallel arithmetic logic processor with automatic Viterbi traceback bit store, said processor comprising a plurality of accumulators and a plurality of data registers connected to said accumulators, each said accumulator comprising:

an adder receiving a first and second data input, providing a data output, and comprising means to add, subtract and compare said data inputs in response to a plurality of control signals;

said adder further comprising a traceback output having a value dependent on the results of said compare operation;

a traceback shift register receiving said traceback output and comprising a gated shifting means; and a Viterbi mode signal connected to said gated shifting means, wherein said traceback output is shifted into said traceback shift register when said Viterbi mode signal is active and said compare operation is performed.

2. The processor of claim 1, wherein:

said control signals comprise a subtract signal indicating whether a present adder calculation is an addition or subtraction and a compare signal indicating whether said present calculation is a comparison operation;

each said data input comprises a high and a low input segment and said data output comprises a high and low output segment;

each said adder comprising:
a first adder portion and a second adder portion, wherein each said adder portion comprises means to add and subtract a plurality of data input segments, receives a carry-in signal and said subtract signal, and generates a carry-out signal and a data output segment;

said first adder portion receiving first and second sub-inputs and generating said high output segment and a sign signal, said high output segment is the sum of said first and second sub-inputs when said subtract signal is inactive and the difference between said first and second sub-inputs when said subtract signal is active, said sign signal being active when said difference is negative;

said second adder portion receiving third and fourth sub-inputs and generating said low output segment and a carry-out signal, said low output segment is the sum of said first and second sub-inputs when said subtract signal is inactive and the difference between said first and second sub-inputs when said subtract signal is active;

a compare mode signal connected to said adders and indicating whether said compare operation is a minimum or maximum function;

a traceback bit circuit receiving said sign signal and said compare mode signal as input and generating said traceback output as a logical combination of said sign and compare mode signals;

a first output selecting means for selecting one of said high output segment, said first sub-input, and said second sub-input as said high output segment in response to said compare signal and said traceback output; and a second output selecting means for selecting one of said high output segment, said third sub-input, and said fourth sub-input as said low output segment in response to said compare signal and said traceback output.

3. The processor of claim 2, wherein:

said control signals further comprise a split signal;

said adder further comprises a split selection means for selectably connecting said first and second adder portions; wherein said carry-out signal from said second adder portion is connected to said carry-in signal of said first adder portion when said split signal is inactive; and an alternate carry-in signal is connected to said carry-in signal of said first adder portion when said split signal is active.

4. The processor of claim 3, wherein said alternate carry-in signal equals said subtract signal.

5. The processor of claim 2, wherein:

said first adder portion receives said first high input segment as said first sub-input and selectably receives one of said first low input segment and said second low input segment as said second sub-input; and said second adder portion selectably receives one of said first low input segment and a null data sequence as said third sub-input and selectably receives one of said second low input segment and said null data sequence as said fourth sub-input.

6. An integrated circuit comprising a dual multiply-accumulate processor with automatic Viterbi traceback bit store, said processor comprising:

two multiply-accumulate processing elements;

a plurality of data registers connected to said processing elements, each said processing element comprising:
a multiplier connected to said data registers; and
an accumulator receiving a plurality of data inputs from said data registers, producing an accumulated output connected to at least one of said data registers, and comprising:
an adder receiving a first and second data input, providing a data output, and comprising means to add, subtract and compare said data inputs in response to a plurality of control signals;
said adder further comprising a traceback output having a value dependent on the results of said compare operation;
a traceback shift register receiving said traceback output and comprising a gated shifting means; and
a Viterbi mode signal connected to said gated shifting means, wherein said traceback output is shifted into said traceback shift register when said Viterbi mode signal is active and said compare operation is performed.

7. The integrated circuit of claim 6, wherein:

said control signals comprise a subtract signal indicating whether a present adder calculation is an addition or subtraction and a compare signal indicating whether said present calculation is a comparison operation;

each said data input comprises a high and a low input segment and said data output comprises a high and low output segment;

each said adder comprises:

a first adder portion and a second adder portion, wherein each said adder portion comprises means to add and subtract a plurality of data input segments, receives a carry-in signal and said subtract signal, and generates a carry-out signal and a data output segment;

said first adder portion receiving first and second sub-inputs and generating said high output segment and a sign signal, said high output segment is the sum of said first and second sub-inputs when said subtract signal is inactive and the difference between said first and second sub-inputs when said subtract signal is active, said sign signal being active when said difference is negative;

said second adder portion receiving third and fourth sub-inputs and generating said low output segment and a carry-out signal, said low output segment is the sum of said first and second sub-inputs when said subtract signal is inactive and the difference between said first and second sub-inputs when said subtract signal is active;

a compare mode signal connected to said adders and indicating whether said compare operation is a minimum or maximum function;

a traceback bit circuit receiving said sign signal and said compare mode signal as input and generating said traceback output as a logical combination of said sign and compare mode signals;

a first output selecting means for selecting one of said high output segment, said first sub-input, and said second sub-input as said high output segment in response to said compare signal and said traceback output; and a second output selecting means for selecting one of said high output segment, said third sub-input, and said fourth sub-input as said low output segment in response to said compare signal and said traceback output.

8. The integrated circuit claim 7, wherein:

said control signals further comprise a split signal;

said adder further comprises a split selection means for selectably connecting said first and second adder portions; wherein said carry-out signal from said second adder portion is connected to said carry-in signal of said first adder portion when said split signal is inactive; and an alternate carry-in signal is connected to said carry-in signal of said first adder portion when said split signal is active.

9. The integrated circuit of claim 8, wherein said alternate carry-in signal equals said subtract signal.

10. The integrated circuit of claim 7, wherein:

said first adder portion receives said first high input segment as said first sub-input and selectably receives receiving one of said first low input segment and said second low input segment as said second sub-input; and said second adder portion selectably receives one of said first low input segment and a null data sequence as said third sub-input and one of said second low input segment and said null data sequence as said fourth sub-input.

11. A method of performing a Viterbi compare-select operation and concurrently storing a Viterbi traceback bit comprising the steps of:

(a) providing a compare mode signal indicating whether a compare-select operation should return a minimum or maximum value;

(b) providing a first and a second precalculated path metric value;

(c) subtracting said second path metric value from said first path metric value to determine a difference and a sign bit, said sign bit is active when said difference is less than zero and inactive when said difference is greater than or equal to zero;

(d) logically combining said sign bit with said comparison mode bit to generate a traceback select bit;

(e) selecting one of said first path metric or said second path metric according to the value of said traceback select bit;

(f) outputting said selected path metric as the results of said compare-select operation; and (g) shifting said traceback select bit into a traceback shift register;

wherein steps (f) and (g) are performed concurrently.

12. The method of claim 11, further comprising the step of providing a Viterbi mode bit signal, said step of shifting occurring only when said Viterbi mode bit signal is active.

13. An arithmetic logic processor with automatic Viterbi traceback bit store comprising:

an adder receiving a first and second data input, providing a data output, and comprising means to add, subtract and compare said data inputs in response to a plurality of control signals;

said adder further comprising a traceback output having a value dependent on the results of said compare operation;

a traceback shift register receiving said traceback output and comprising a gated shifting means; and a Viterbi mode signal connected to said gated shifting means, wherein said traceback output is shifted into said traceback shift register when said Viterbi mode signal is active and said compare operation is performed.

14. The processor of claim 13, wherein:

said control signals comprise a subtract signal indicating whether a present adder calculation is an addition or subtraction and a compare signal indicating whether said present calculation is a comparison operation;

each said data input comprises a high and a low input segment and said data output comprises a high and low output segment;

said adder comprising:

a first adder portion and a second adder portion, each said adder portion comprising means to add and subtract a plurality of data input segments, receiving a carry-in signal and said subtract signal, and generating a carry-out signal and a data output segment;

said first adder portion receiving first and second sub-inputs and generating said high output segment and a sign signal, said high output segment is the sum of said first and second sub-inputs when said subtract signal is inactive and the difference between said first and second sub-inputs when said subtract signal is active, said sign signal being active when said difference is negative;

said second adder portion receiving third and fourth sub-inputs and generating said low output segment and a carry-out signal, said low output segment is the sum of said first and second sub-inputs when said subtract signal is inactive and the difference between said first and second sub-inputs when said subtract signal is active;

a compare mode signal connected to said adders and indicating whether said compare operation is a minimum or maximum function;

a traceback bit circuit receiving said sign signal and said compare mode signal as input and generating said traceback output as a logical combination of said sign and compare mode signals;

a first output selecting means for selecting one of said high output segment, said first sub-input, and said second sub-input as said high output segment in response to said compare signal and said traceback output; and a second output selecting means for selecting one of said high output segment, said third sub-input, and said fourth sub-input as said low output segment in response to said compare signal and said traceback output.

15. The processor of claim 14, wherein:

said control signals further comprise a split signal;

said adder further comprises a split selection means for selectably connecting said first and second adder portions;

said carry-out signal from said second adder portion being connected to said carry-in signal of said first adder portion when said split signal is inactive; and an alternate carry-in signal being connected to said carry-in signal of said first adder portion when said split signal is active.

16. The processor of claim 15 wherein said alternate carry-in signal equals said subtract signal.

17. The processor of claim 14, wherein:

said first adder portion receives said first high input segment as said first sub-input and selectably receives one of said first low input segment and said second low input segment as said second sub-input; and said second adder portion selectably receives one of said first low input segment and a null data sequence as said third sub-input and one of said second low input segment and said null data sequence as said fourth sub-input.

* * * * *